(12) United States Patent
Morinaga et al.

(10) Patent No.: US 7,235,516 B2
(45) Date of Patent: Jun. 26, 2007

(54) SEMICONDUCTOR CLEANING COMPOSITION COMPRISING AN ETHOXYLATED SURFACTANT

(75) Inventors: Hitoshi Morinaga, Fukuoka (JP); Hideaki Mochizuki, Fukuoka (JP); Atsushi Itou, Fukuoka (JP)

(73) Assignee: Mitsubishi Chemical Corporation, Tokyo (JP)

( * ) Notice: Subject to any disclaimer, the term of this patent is extended or adjusted under 35 U.S.C. 154(b) by 247 days.

(21) Appl. No.: 10/294,658

(22) Filed: Nov. 15, 2002

(65) Prior Publication Data

US 2003/0144163 A1  Jul. 31, 2003

(30) Foreign Application Priority Data

Nov. 16, 2001  (JP) .................. P. 2001-350947

(51) Int. Cl.
*C11D 3/395* (2006.01)
*C11D 7/06* (2006.01)
*C11D 1/72* (2006.01)

(52) U.S. Cl. .............. 510/175; 510/178; 510/367; 510/372; 510/375; 510/421; 510/426; 510/435; 510/436; 134/1; 134/1.1; 134/1.2; 134/1.3

(58) Field of Classification Search ............ 510/175, 510/178, 367, 372, 375, 421, 426, 435, 436; 134/1, 1.1, 1.2, 1.3
See application file for complete search history.

(56) References Cited

U.S. PATENT DOCUMENTS

| | | | | |
|---|---|---|---|---|
| 4,239,661 A | * | 12/1980 | Muraoka et al. ............ 438/471 |
| 4,339,340 A | * | 7/1982 | Muraoka et al. ............ 252/79.5 |
| 4,507,278 A | * | 3/1985 | DeMarco et al. ............ 424/62 |
| 5,460,747 A | * | 10/1995 | Gosselink et al. .......... 510/220 |
| 5,466,389 A | * | 11/1995 | Ilardi et al. ................. 510/175 |
| 5,505,873 A | * | 4/1996 | Akabane et al. ........ 252/186.38 |
| 5,527,423 A | * | 6/1996 | Neville et al. .............. 438/693 |
| 5,552,556 A | * | 9/1996 | Miracle et al. .......... 548/334.1 |
| 5,651,861 A | * | 7/1997 | Larson et al. .................. 162/5 |
| 5,656,097 A | * | 8/1997 | Olesen et al. .................. 134/1 |
| 5,705,089 A | * | 1/1998 | Sugihara et al. ............ 252/79.1 |
| 5,739,096 A | * | 4/1998 | Rees .......................... 510/376 |
| 5,885,362 A | | 3/1999 | Morinaga et al. |
| 5,908,509 A | * | 6/1999 | Olesen et al. ................. 134/1.3 |
| 5,950,645 A | * | 9/1999 | Olesen et al. .............. 134/98.1 |
| 6,114,298 A | * | 9/2000 | Petri et al. .................. 510/372 |
| 6,143,706 A | | 11/2000 | Morinaga |
| 6,162,778 A | * | 12/2000 | McKillop et al. ........... 510/235 |
| 6,228,179 B1 | | 5/2001 | Morinaga |
| 6,228,823 B1 | | 5/2001 | Morinaga et al. |
| 6,267,122 B1 | | 7/2001 | Guldi et al. |
| 6,309,560 B1 | * | 10/2001 | Kaufman et al. .......... 252/79.1 |
| 6,323,169 B1 | * | 11/2001 | Abe et al. .................. 510/176 |
| 6,465,403 B1 | * | 10/2002 | Skee .......................... 510/175 |
| 6,498,132 B2 | | 12/2002 | Morinaga et al. |
| 6,630,433 B2 | * | 10/2003 | Zhang et al. ............... 510/175 |
| 6,699,828 B1 | * | 3/2004 | de Buzzaccarini et al. . 510/372 |
| 6,927,176 B2 | * | 8/2005 | Verhaverbeke et al. ..... 438/745 |

FOREIGN PATENT DOCUMENTS

| | | |
|---|---|---|
| EP | 0 496 605 | 7/1992 |
| EP | 0 561 236 | 9/1993 |
| EP | 0 805 484 | 11/1997 |
| EP | 0 871 209 | 10/1998 |
| JP | 63-274149 | * 11/1998 |

OTHER PUBLICATIONS

Derwent Publications, AN 88-364313, XP-002083476, JP 63-274149, Nov. 11, 1988.
H. Morinaga, et al., Materials Research Society Symposium Proceedings, vol. 477, pp. 35-46, XP-000978137. "Advanced Alkali Cleaning Solution for Simplification of Semiconductor Cleaning Process", 1997.

* cited by examiner

*Primary Examiner*—Charles Boyer
(74) *Attorney, Agent, or Firm*—Oblon, Spivak, McClelland, Maier & Neustadt, P.C.

(57) ABSTRACT

A substrate surface cleaning liquid medium and a cleaning method using the cleaning liquid medium are capable of removing finely particulate contaminants more efficiently than conventional techniques from substrates for devices in the production of semiconductor devices, display devices, etc., which cleaning liquid medium contains the following ingredients (A), (B), (C), and (D), has a pH of 9 or higher, and a content of ingredient (C) of 0.01 to 4% by weight:
(A) an ethylene oxide addition type surfactant which has an optionally substituted hydrocarbon group and a polyoxyethylene group in the same molecular structure and in which the ratio of the number of carbon atoms contained in the hydrocarbon group (m) to the number of oxyethylene groups in the polyoxyethylene group (n), m/n, is $m/n \leq 1.5$,
(B) an alkali ingredient,
(C) hydrogen peroxide, and
(D) water.

23 Claims, No Drawings

SEMICONDUCTOR CLEANING COMPOSITION COMPRISING AN ETHOXYLATED SURFACTANT

FIELD OF THE INVENTION

The present invention relates to cleaning liquid mediums for cleaning the surfaces of substrates for devices in steps in the production of semiconductor devices, display devices, or the like and to a method of cleaning with the same. More particularly, the invention relates to substrate surface cleaning liquid mediums and a cleaning method which are effective in efficiently removing contaminant particles (fine particles) present on a substrate in a certain time period to highly clean the substrate surface.

BACKGROUND OF THE INVENTION

In steps in the production of semiconductor devices such as microprocessors, memories, and CCDs or of flat panel display devices such as TFT liquid-crystal displays, a circuit pattern or thin film of submicron size is formed on surfaces of substrates made of silicon (Si), silicon oxide ($SiO_2$), glass, or another material. It is extremely important to reduce the contaminants present in a slight amount on the substrate surface in each step in the production.

Among such contaminants, fine particles such as, e.g., silica particles, alumina particles and particles of organic substances especially reduce the yield of devices. It is therefore necessary to reduce these fine particles as much as possible before the substrate is sent to the subsequent step. The technique generally employed for the removal of such contaminants is to clean the substrate surface with a cleaning liquid medium.

It is generally known that alkaline solutions are effective in the removal of particulate contaminants. Alkaline aqueous solutions such as aqueous solutions of ammonia, potassium hydroxide, tetramethylammonium hydroxide, or the like are used for the surface cleaning of silicon or $SiO_2$ substrates for semiconductor devices or glass substrates for display devices. Cleaning with a cleaning liquid medium comprising ammonia, hydrogen peroxide, and water (referred to as "SC-1 cleaning liquid medium" or "APM cleaning liquid medium") is also used extensively (this cleaning is referred to as "SC-1 cleaning" or "APM cleaning") (see, for example, W. Kern and D. A. Puotinen, *RCA Review*, p.187, June (1970)). The cleaning generally requires from 1 to 15 minutes.

Typical apparatus for the cleaning are of two kinds. One of these is a batch cleaning apparatus in which two or more substrates placed in a cassette are cleaned usually by immersion in a cleaning liquid medium placed in a cleaning tank. The other is a sheet-by-sheet (so-called single wafer) cleaning apparatus in which one substrate is attached to a holder and a cleaning liquid medium is sprinkled over the substrate surface usually while revolving the substrate (e.g., when the substrate has a disk form, it is revolved in the circumferential direction). The batch cleaning apparatus can treat a large number of substrates per unit time (has a high throughput). However, this apparatus not only has a large size but also has problems, for example, that the contaminants which have been released from the device formation-side surface of a substrate or from the back side thereof may readhere to the device formation-side surface of another substrate to cause the so-called cross contamination and that it is necessary to use the cleaning liquid medium in a large amount even when only one substrate is cleaned.

On the other hand, the sheet-by-sheet cleaning apparatus has a small size and is free from cross contamination. However, it has a problem that the throughput is low because substrates are cleaned one by one.

Recently, as a result of the trend toward higher fineness in circuit patterns, particles smaller than those which have been regarded as contaminants have become problematic. Particles have the property of becoming difficult to remove as the particle diameter thereof decreases. It has been pointed out that the APM cleaning is insufficient in the ability to remove fine particles having a particle diameter on a 0.1 μm level (see H. Morinaga, T. Futatsuki, and T. Ohmi, *J. Electrochem. Soc.*, Vol.142, p.966 (1995)). In device production, a further improvement in throughput and a further increase in production efficiency are desired and to reduce the cleaning time also is an important subject.

APM cleaning has been used for more than 30 years in order to remove particulate contaminants. At present, however, the particle diameters of the particles which should be removed are far smaller and the production efficiency required is far stricter as compared with those at that time when this cleaning method was developed. There is a desire for a cleaning method which can more efficiently remove fine particles to highly clean the substrate surface in a shorter time period.

On the other hand, addition of various surfactants to an alkaline cleaning liquid medium has been proposed for the purpose of, e.g., inhibiting the substrate surface from being roughened or etched, improving wetting properties, or improving the ability to remove oily contaminants or particulate contaminants.

For example, Japanese Patent Laid-Open No. 335294/1993 proposes a technique for inhibiting a substrate surface from being roughened. This technique comprises adding a surfactant to an alkaline solution of hydrogen peroxide and thereby regulating the solution so as to have a contact angle of 10° or smaller with semiconductor substrates.

Japanese Patent No. 3,169,024 proposes a technique for improving the substrate surface-wetting properties of a cleaning liquid medium. This technique comprises adding an ethylene oxide addition type nonionic surfactant which has a polyoxyethylene group and the number of ethylene oxide (oxyethylene) groups in the polyoxyethylene group is from 3 to 10 to an alkaline cleaning liquid medium containing hydrogen peroxide.

Japanese Patent Laid-Open No. 2001-40389 proposes to add various surfactants to an alkaline aqueous solution in order to inhibit the silicon substrate from being etched.

Japanese Patent Laid-Open No. 121418/1999 proposes a cleaning liquid medium for semiconductor substrates which contains a specific surfactant so as to have the improved ability to remove, in particular, oily contaminants.

Japanese Patent Laid-Open No. 245281/1995 proposes to add an alkylbenzenesulfonic acid to an alkaline cleaning liquid medium containing hydrogen peroxide in order to improve the ability to remove contaminants. Furthermore, Japanese Patent Laid-Open No. 251416/1993 proposes to add a fluorochemical surfactant comprising a fluoroalkylsulfonamide compound to an APM cleaning liquid medium in order to improve the ability to remove particles.

However, even when those known surfactants are actually added to an APM cleaning liquid medium for the purpose of more efficiently removing fine particles on a 0.1 μm level in a shorter time period, which is the recent subject as stated above, then no improvement is obtained in the ability to remove particles on a 0.1 μm level or use of the cleaning liquid medium thus obtained poses problems because it produces the following side effects (1) to (4).

(1) The surfactants in the cleaning liquid mediums separate out as oil droplets at room temperature or elevated temperatures. The cleaning liquid mediums thus become milk-white. They have reduced cleaning performance and use of these cleaning liquid mediums results, for example, in residual oil droplets on the substrate surface.
(2) The cleaning liquid mediums froth considerably and adversely influence the operation of the cleaning apparatus.
(3) The surfactants themselves remain on the substrate surface.
(4) The surfactants are substances which may adversely influence the natural environment and there is no appropriate method of treatment for waste liquids resulting from the cleaning.

SUMMARY OF THE INVENTION

The invention has been achieved in order to eliminate the problems described above. An aim of the invention is to provide cleaning liquid mediums capable of removing finely particulate contaminants more efficiently than conventional techniques from substrates for devices in the production of semiconductor devices, display devices, or the like. Another aim of the invention is to provide a cleaning method which enables the cleaning.

In order to accomplish those aims, the present inventors directed attention to the technique in which a surfactant is added to an APM cleaning liquid medium as a base.

The present inventors made intensive investigations in order to overcome the problems described above. As a result, they have found that when a specific surfactant is incorporated into a liquid mixture comprising water, an alkali, and hydrogen peroxide and having a pH of 9 or higher, then the ability to remove finely particulate contaminants is greatly improved and this cleaning liquid medium produces almost no side effects. It has also been found that this cleaning effect is improved by optimizing the concentration of hydrogen peroxide. The inventors have further found that this surface cleaning liquid medium for device substrates simultaneously satisfies the ability to remove particles from a substrate surface and the property of inhibiting the substrate surface from being etched. In addition, this cleaning liquid medium is almost free from the decrease in percentage removal of particles which accompanies a decrease in cleaning liquid medium temperature during cleaning and has been a problem for cleaning liquid mediums heretofore in use. Namely, the cleaning liquid medium was found to have an unexpected effect that even when it is used at temperatures around 50° C., which are regarded as low for substrate cleaning, the cleaning liquid medium shows the high ability to remove particles (under such conditions, etching is, of course, inhibited). The invention has been thus completed.

The invention provides a substrate surface cleaning liquid medium which comprises the following ingredients (A), (B), (C), and (D), has a pH of 9 or higher, and a content of ingredient (C) of from 0.01 to 4% by weight:

(A) an ethylene oxide addition type surfactant which has an optionally substituted hydrocarbon group and a polyoxyethylene group in the same molecular structure and in which the ratio of the number of carbon atoms contained in the hydrocarbon group (m) to the number of oxyethylene groups in the polyoxyethylene group, i.e., m/n, is 1.5 or less,
(B) an alkali ingredient,
(C) hydrogen peroxide, and
(D) water.

The invention further provides a substrate surface cleaning liquid medium which, when used for cleaning a substrate surface, attains a percentage removal of particles of 94% or higher after the cleaning with respect to the removal of particles having a particle diameter of 0.06 μm or larger present on the surface, and which, when used for cleaning a substrate surface having a silicon thermal oxide film thereon, etches the silicon thermal oxide film to a depth of 1 nm or less.

DETAILED DESCRIPTION OF THE INVENTION

Ingredient (A) in the invention is an ethylene oxide addition type surfactant which has an optionally substituted hydrocarbon group and a polyoxyethylene group in the same molecular structure, and is characterized in that the ratio of the number of carbon atoms contained in the hydrocarbon group (m) to the number of oxyethylene groups in the polyoxyethylene group (n) is 1.5 or less.

Examples of this surfactant include polyoxyalkylene alkyl ethers such as polyoxyethylene alkyl ethers, polyoxyalkylene alkylphenyl ethers, polyoxyalkylene fatty acid esters, polyoxyalkylene alkylamines, and polyoxyalkylene alkyl ether sulfates. Preferred of these are those which have as the optionally substituted hydrocarbon group an alkyl group having no phenyl group. Specific examples of such preferred surfactants include polyoxyethylene alkyl ethers, polyoxyalkylene alkyl ethers, polyoxyethylene fatty acid esters, polyoxyethylene alkylamines, and polyoxyethylene alkyl ether sulfates. Especially preferred from the standpoints of the ability to remove particles, etc. are polyoxyethylene alkyl ethers represented by formula (2) and polyoxyalkylene alkyl ethers represented by formula (3):

  (2)

  (3)

wherein $R^2$ represents an alkyl group which may have one or more substituents selected from the group consisting of a hydroxy group, an amino group, an alkoxy group and a halogen atom; $C_3H_6O$ represents an oxypropylene group; n is a natural number of 50 or less; and n' is a natural number of 20 or less.

The ratio of the number of carbon atoms contained in the optionally substituted hydrocarbon group (m) to the number of oxyethylene groups in the polyoxyethylene group (n), m/n, is not particularly limited as long as it is 1.5 or lower. However, the ratio is preferably $0.5 \leq m/n \leq 1.5$, more preferably $0.7 \leq m/n \leq 1.5$, most preferably $1.0 \leq m/n \leq 1.4$. When m/n is too low, there are cases where the ability to remove particles is reduced and the increased length of the oxyethylene chain not only makes the surfactant have reduced solubility in water but also poses problems, for example, that the burden of waste liquid treatment increases. On the other hand, values of m/n exceeding 1.5 are undesirable in that the surfactant in the alkaline liquid medium separates out as fine oil droplets to make the liquid medium milk-white and pose problems, for example, that the cleaning performance is reduced and oil droplets remain. In the case where the main chain has one or more hydrocarbon groups as substituents, the total number of carbon atoms in the hydrocarbon group as the main chain and in the hydrocarbon groups as substituents is referred to as m.

The number of oxyethylene groups in the polyoxyethylene group (n) is preferably $10 \leq n \leq 50$, more preferably $11 \leq n \leq 25$, most preferably $11 \leq n \leq 15$. When n is less than 10, there are cases where the ability to remove particles is reduced even when the ratio m/n is within the optimal range shown above. On the other hand, too large values of n are undesirable in that there are problems, for example, that the burden of waste liquid treatment increases and the surfactant is apt to decompose in the cleaning liquid medium.

Specific examples of such surfactants include polyoxyethylene (n=11) lauryl ether, polyoxyethylene (n=15) cetyl ether, polyoxyethylene (n=20) oleyl ether, and polyoxyethylene (n=14) oleylcetyl ether.

Those surfactants may be used alone or in combination of two or more thereof in any desired ratio. In the case where two or more surfactants (compounds) differing in m and n are used simultaneously, one of these may be a compound in which m/n exceeds 1.5 as long as the effects of the invention are not lessened thereby. In this case, the value of m/n in which m and n each are the average of the m's or n's for all the surfactant compounds used is preferably $m/n \leq 1.5$, more preferably $0.5 \leq m/n \leq 1.5$.

The content of ingredient (A) in the cleaning liquid medium is generally from 0.0001 to 0.5% by weight, preferably from 0.0003 to 0.1% by weight, more preferably from 0.001 to 0.01% by weight, based on the cleaning liquid medium. When the concentration of the surfactant (A) is too low, the ability of the surfactant to remove particulate contaminants is insufficient. When the concentration thereof is increased too high, not only the ability to remove particulate contaminants remains unchanged but also there are cases where the cleaning liquid medium froths considerably, is unsuitable for use in cleaning steps, and increases the burden of waste liquid treatment with biodegradation.

The surfactant (A) in the ordinary form on the market may contain metal impurities, e.g., Na, K, and Fe, in an amount of about from 1 ppm to several thousand ppm by weight. Consequently, there is the possibility that the surfactant (A) to be used in the invention might be a metal contamination source. Because of this, the content of each metal impurity contained in the surfactant (A) to be used in the invention is reduced beforehand to preferably 3 ppm by weight or less, more preferably 1 ppm by weight or less. For obtaining a surfactant purified to such a degree, purification may be conducted, for example, by dissolving a surfactant in water and passing the resultant solution through an ion-exchange resin to catch the metal impurities with the resin.

The alkali ingredient to be used as ingredient (B) in the invention is a general term for alkaline ingredients which upon dissolution in water give solutions whose pH values are in the alkaline region. The alkali ingredient (B) is not particularly limited. However, typical examples thereof include ammonium hydroxide (aqueous ammonia solution) and organic alkalis.

Examples of the organic alkalis include amine compounds such as quaternary ammonium hydroxides, amines, and amino alcohols. Preferred quaternary ammonium hydroxides are ones having alkyl groups which have 1 to 4 carbon atoms and may be substituted with a hydroxy group, an alkoxy group or a halogen atom. These substituents may be the same or different. Examples of such alkyl groups include methyl, ethyl, propyl, butyl, hydroxymethyl, hydroxyethyl, hydroxypropyl, and hydroxybutyl.

Specific examples of such quaternary ammonium hydroxides include tetramethylammonium hydroxide (TMAH), tetraethylammonium hydroxide, trimethyl(hydroxyethyl)-ammonium hydroxide (common name: choline), and triethyl (hydroxyethyl)ammonium hydroxide. Examples of the amine compounds other than these include ethylenediamine, monoethanolamine, and triethanolamine.

Also usable are the hydroxides of alkali metals or alkaline earth metals, such as sodium hydroxide, potassium hydroxide, and calcium hydroxide, and alkaline salts such as sodium hydrogen carbonate and ammonium hydrogen carbonate.

Preferred of those alkali ingredients enumerated above are ammonium hydroxide, tetramethylammonium hydroxide (TMAH), and trimethyl(hydroxyethyl)ammonium hydroxide (common name: choline) from the standpoints of cleaning effect, reduced residual metal amount, profitability, cleaning liquid medium stability, etc. Especially preferred is ammonium hydroxide.

Those alkali ingredients may be used alone or in combination of two or more thereof in any desired ratio. The concentration of the alkali ingredient in the cleaning liquid medium of the invention may be suitably selected. However, it is generally preferably from 0.001 to 5% by weight, more preferably from 0.002 to 1% by weight. In case where the concentration thereof is too low, the contaminant-removing effect which is to be attained by the invention cannot be obtained. On the other hand, too high concentrations thereof are undesirable in that not only the effect is not enhanced any more and such high concentrations are uneconomical, but also there is a stronger possibility that the substrate surface might be damaged by etching.

Ingredient (C) in the invention is hydrogen peroxide. The presence of hydrogen peroxide in a given concentration is important especially in the cleaning of substrates in which silicon is exposed on the surface. Silicon has the property of readily dissolving in alkaline solutions. Hydrogen peroxide oxidizes the silicon surface to form an extremely thin $SiO_2$ film. Since this $SiO_2$ film has a far lower rate of dissolution under alkaline conditions than silicon, it can inhibit etching and surface roughening. In conventional techniques, the concentration of hydrogen peroxide in the alkaline cleaning liquid mediums is 1% by weight or more, preferably 3% by weight or more, and too low concentrations of hydrogen peroxide lead to problems that the silicon is excessively etched and the surface is roughened.

The present inventors made investigations on the optimal hydrogen peroxide concentration in substrate surface cleaning liquid mediums on the premise that the specific surfactant (A) described above is added. As a result, it has been found that even when the hydrogen peroxide concentration is lower than in the conventional techniques, the problem of substrate surface roughening can be overcome while maintaining sufficient cleaning performance. The concentration of hydrogen peroxide in the cleaning liquid medium of the invention is generally from 0.01 to 4% by weight, preferably from 0.05 to less than 3% by weight, more preferably from 0.1 to less than 2% by weight, most preferably from 0.2 to less than 1% by weight. When the concentration of hydrogen peroxide is too low, there are cases where problems such as the following (1) to (3) arise.

1) The silicon is excessively etched or the surface is roughened.
2) The ability of hydrogen peroxide to remove organic contaminants is reduced.
3) An $SiO_2$ film is not sufficiently formed, so that the hydrophobic bare silicon (uncovered with an oxide film) remains exposed on the surface. Since this bare silicon repels the cleaning liquid medium or the ultrapure water to be used for rinsing, the cleaning performance decreases.

On the other hand, when the concentration of hydrogen peroxide is too high, not only a higher cleaning effect cannot be expected, but also there are cases where the following and other problems arise: 1) the hydrogen peroxide oxidatively decomposes the surfactant and other organic additives; 2) the cleaning cost increases; and 3) the burden of waste liquid treatment increases.

In the cleaning liquid medium of the invention, the ratio of the content of the specific surfactant (A), a, to the content of hydrogen peroxide (C), c, i.e., the ratio a/c, is generally $1/3000 \leq a/c \leq 1/20$, preferably $1/1500 \leq a/c \leq 1/30$, more preferably $1/1000 \leq a/c \leq 1/50$, most preferably $1/1000 \leq a/c \leq 1/100$. In case where a/c is too small, not only the ability to remove particulate contaminants decreases but also the surfactant is apt to be decomposed by the hydrogen peroxide. When a/c is too large, there are cases where such large surfactant ratios pose problems, for example, that the surfactant remains on the substrate surface and the cleaning liquid medium froths during cleaning.

Ingredient (D) in the invention is water. In the case where a highly clean substrate surface is desired, the water to be used generally is deionized water, preferably ultrapure water. It is also possible to use electrolytic ionic water obtained by water electrolysis or hydrogenated water obtained by dissolving hydrogen gas in water.

Besides the ingredients (A), (B), (C), and (D) described above, a complexing agent may be incorporated into the cleaning liquid medium of the invention. The incorporation of a complexing agent is preferred in that it is effective in obtaining an extremely highly clean substrate surface on which metallic contaminants have been further diminished. The complexing agent to be used in the invention may be any of known complexing agents. In selecting a complexing agent, all of the level of contamination of the substrate surface, kind of the metal, level of cleanness required of the substrate surface, complexing agent cost, chemical stability, and other factors may be taken into account. Examples of the complexing agent include the compounds enumerated under the following (1) to (4).

(1) Compounds Having Nitrogen as Donor Atom and Carboxyl and/or Phosphono Group

Examples thereof include amino acids such as glycine; nitrogen-containing carboxylic acids such as iminodiacetic acid, nitrilotriacetic acid, ethylenediaminetetraacetic acid [EDTA], trans-1,2-diaminocyclohexanetetraacetic acid [CyDTA], diethylenetriaminepentaacetic acid [DTPA], and triethylenetetraminehexaacetic acid [TTHA]; and nitrogen-containing phosphonic acids such as ethylenediaminetetrakis(methylenephosphonic acid) [EDTPO], nitrilotris(methylenephosphonic acid) [NTPO], and propylenediaminetetra(methylenephosphonic acid) [PDTMP].

(2) Compounds Having Aromatic Hydrocarbon Ring and Two or More OH and/or $O^-$ Groups Directly Bonded to Constituent Carbon Atoms of the Ring Examples thereof include phenols and derivatives thereof, such as catechol, resorcinol, and Tiron.

(3) Compounds Having Both the Structures (1) and (2)

(3-1) Ethylenediaminedi-o-hydroxyphenylacetic Acid [EDDHA] and Derivatives Thereof Examples thereof include nitrogen-containing aromatic carboxylic acids such as ethylenediaminedi-o-hydroxyphenylacetic acid [EDDHA], ethylenediamine-N,N'-bis[(2-hydroxy-5-methylphenyl)acetic acid] [EDDHMA], ethylenediamine-N,N'-bis[(2-hydroxy-5-chlorophenyl)acetic acid] [EDDHCA], and ethylenediamine-N,N'-bis[(2-hydroxy-5-sulfophenyl)acetic acid] [EDDHSA]; and nitrogen-containing aromatic phosphonic acids such as ethylenediamine-N, N'-bis[(2-hydroxy-5-methylphenyl)phosphonic acid] and ethylenediamine-N,N'-bis[(2-hydroxy-5-phosphophenyl)-phosphonic acid].

(3-2) N,N'-Bis(2-hydroxybenzyl)ethylenediamine-N,N'-diacetic Acid [HBED] and Derivatives Thereof Examples thereof include N,N'-bis(2-hydroxybenzyl)ethylenediamine-N,N'-diacetic acid [HBED], N,N'-bis(2-hydroxy-5-methylbenzyl)ethylenediamine-N,N'-diacetic acid [HMBED], and N,N'-bis(2-hydroxy-5-chlorobenzyl)ethylenediamine-N,N'-diacetic acid.

(4) Others

Other examples include amines such as ethylenediamine, 8-quinolinol, and o-phenanthroline; carboxylic acids such as formic acid, acetic acid, oxalic acid, and tartaric acid; hydrogen halides or salts thereof, such as hydrofluoric acid, hydrochloric acid, hydrogen bromide, and hydrogen iodide; and oxoacids and salts thereof, such as phosphoric acid and condensed phosphoric acids.

Those complexing agents may be used in the form of an acid or a salt, e.g., ammonium salt.

Preferred of those complexing agents from the standpoints of cleaning effect, chemical stability, etc. are nitrogen-containing carboxylic acids such as ethylenediaminetetraacetic acid [EDTA] and diethylenetriaminepentaacetic acid [DTPA]; nitrogen-containing phosphonic acids such as ethylenediaminetetrakis(methylenephosphonic acid) [EDTPO] and propylenediaminetetra(methylenephosphonic acid) [PDTMP]; ethylenediamined-o-hydroxyphenylacetic acid [EDDHA] and derivatives thereof; and N,N'-bis(2-hydroxybenzyl)ethylenediamine-N,N'-diacetic acid [HBED].

Especially preferred of those from the standpoint of cleaning effect are ethylenediamined-o-hydroxyphenylacetic acid [EDDHA], ethylenediamine-N,N'-bis[(2-hydroxy-5-methylphenyl)acetic acid] [EDDHMA], diethylenetriaminepentaacetic acid [DTPA], ethylenediaminetetraacetic acid [EDTA], and propylenediaminetetra(methylenephosphonic acid) [PDTMP].

Those complexing agents may be used alone or in combination of two or more thereof in any desired ratio. The concentration of the complexing agent in the cleaning liquid medium of the invention may be selected at will according to the kind and amount of the contaminant metal impurity and the level of cleanness required of the substrate surface. However, it is generally preferably from 1 to 10,000 ppm by weight, more preferably from 5 to 1,000 ppm by weight, most preferably from 10 to 200 ppm by weight. In case where the concentration thereof is too low, the contaminant-removing effect and adhesion-preventing effect of the complexing agent cannot be obtained. On the other hand, too high concentrations thereof are undesirable in that not only the effects are not enhanced any more and such high concentrations are uneconomical, but also there is a stronger possibility that the complexing agent might remain adherent to the substrate surface after the surface treatment.

Complexing agents of the ordinary reagent grades on the market may contain metal impurities, e.g., Fe, in an amount of about from 1 ppm to several thousand ppm. Consequently, there is the possibility that the complexing agent to be used in the invention might be a metal contamination source. In an initial stage, such metal impurities are present in the form of a stable complex with the complexing agent. However, while the complexing agent is used as a surface-treating agent over a prolonged period of time, it decomposes to release the metals, which adhere to the substrate surface. Because of this, the content of each of the metal impurities, e.g., Fe, Al, and Cu, contained in the complexing agent to be used in the invention is reduced beforehand to preferably 5 ppm or less, more preferably 2 ppm or less. For obtaining a complexing agent purified to such a degree, purification may be conducted, for example, by dissolving a complexing agent in an acidic or alkaline solution, filtering the resultant solution to remove any insoluble impurities, neutralizing the filtrate to precipitate crystals again, and separating the crystals from the liquid.

In the cleaning liquid medium of the invention, any desired alkali ingredient can be used even when the cleaning liquid medium contains a complexing agent. However, preferred alkali ingredients for use in the cleaning liquid medium containing a complexing agent are ammonium hydroxide, tetramethylammonium hydroxide (TMAH), trimethyl-(hydroxyethyl)ammonium hydroxide (common name: choline), and the like from the standpoints of reduced residual metal amount, profitability, cleaning liquid medium stability, etc. Especially preferred is ammonium hydroxide.

The cleaning liquid medium of the invention is characterized by having a pH of 9 or higher. The pH thereof is not particularly limited as long as it is 9 or higher. However, from the standpoints of particle removal and adhesion prevention, the pH of the cleaning liquid medium is generally preferably from 9 to 12, more preferably from 10 to 11.5. A known pH regulator may be used as long as the effects of the invention are not lessened thereby. In case where the pH of the cleaning liquid medium is too low, the ability to remove particles and the ability to prevent particle adhesion are insufficient. Even when the pH thereof is too high, not only the effects are not enhanced any more and the necessity of a large amount of an alkali is uneconomical, but also there is a stronger possibility that the substrate surface might be damaged by etching.

The cleaning liquid medium of the invention may further contain other ingredients. Examples of such ingredients include organic sulfur-containing compounds (e.g., 2-mercaptothiazoline, 2-mercaptoimidazoline, 2-mercaptoethanol, and thioglycerol), organic nitrogen-containing compounds (e.g., benzotriazole, 3-aminotriazole, $N(R)_3$ (wherein R is an alkyl group having 1 to 4 carbon atoms), $N(ROH)_3$ (wherein R is an alkyl group having 1 to 4 carbon atoms), urea, and thiourea), water-soluble polymers (e.g., polyethylene glycol and poly(vinyl alcohol)), anticorrosive agents such as alkyl alcohol compounds (ROH (wherein R is an alkyl group having 1 to 4 carbon atoms)), acids such as sulfuric acid, hydrochloric acid, and hydrofluoric acid, pH buffers such as ammonium fluoride and ammonium phosphate, reducing agents such as hydrazine, dissolved gases such as hydrogen, argon, nitrogen, and ozone, and known surfactants/organic solvents.

When the cleaning liquid medium of the invention is used to clean a substrate, an exceedingly high particle-removing effect is obtained only through one-step cleaning. However, cleaning may be conducted in two or more steps using the cleaning liquid medium of the invention in combination with one or more other cleaning liquid mediums according to the kinds of contaminants desired to be further removed. Examples of such optional cleaning liquid mediums include a cleaning liquid medium containing hydrofluoric acid, a hydrochloric acid/hydrogen peroxide/water mixture ("SC-2 cleaning liquid medium" or "APM cleaning liquid medium"), a sulfuric acid/hydrogen peroxide mixture ("SPM cleaning liquid medium" or "piranha cleaning liquid medium"), ozonized ultrapure water, and hydrogenated ultrapure water. In particular, a combination of cleaning with a cleaning liquid medium containing hydrofluoric acid and cleaning with the cleaning liquid medium of the invention is preferred in that the metallic contaminants, particulate contaminants, and organic contaminants present on the substrate surface can be efficiently removed in a short time period. Cleaning with a cleaning liquid medium containing hydrofluoric acid is preferably conducted under the conditions of a hydrofluoric acid concentration of from 0.03 to 3% by weight and a cleaning time of from 1 second to 5 minutes.

It is especially preferred to conduct this cleaning under such conditions that the cleaning time is 45 seconds or shorter and the hydrofluoric acid concentration (C), % by weight, and the cleaning time (t), second, satisfy the relationship $0.25 \leq tC^{1.29} \leq 5$. This is because use of such cleaning conditions has the following excellent effects: metallic contaminants can be sufficiently removed in an extremely short time period and almost no side effects are produced such as water marks, particle readhesion, and dimensional change through the treatment due to etching.

For the cleaning liquid medium of the invention and the cleaning method using the same, the substrate to be cleaned may be any of various substrates. Of these, the substrates which are made of semiconductors, glasses, metals, ceramics, resins, magnetic materials, superconductors, or the like and in which particulate contaminants are problematic are suitable for the surface cleaning. In particular, the cleaning liquid medium and cleaning method of the invention are suitable for the cleaning of substrates for semiconductor devices and substrates for display devices, which are required to have exceedingly high surface cleanness. Examples of the materials of such substrates and of the materials of wirings, electrodes, and the like present on the surface thereof include semiconductor materials such as Si, Ge (germanium), and GaAs (gallium-arsenic); insulating materials such as $SiO_2$, silicon nitride, hydrogen silsesquioxane (HSQ), glasses, aluminum oxide, transition metal oxides (e.g., titanium oxide, tantalum oxide, hafnium oxide, and zirconium oxide), $(Ba, Sr)TiO_3$ (BST), polyimides, and organic thermoset resins; and metals such as W (tungsten), Cu (copper), Cr (chromium), Co (cobalt), Mo (molybdenum), Ru (ruthenium), Au (gold), Pt (platinum), Ag (silver), and Al (aluminum) and alloys of these metals, silicides, and nitrides.

In particular, semiconductor device substrates having a semiconductor material such as silicon or an insulating material such as silicon nitride, silicon oxide, or a glass on part or all of the surface are highly strongly desired to be reduced in contamination with fine particles. The cleaning method of the invention is hence suitable for application to these substrates.

For preparing the cleaning liquid medium of the invention, known techniques may be used. The cleaning liquid medium may be prepared by mixing beforehand two or more of constituent ingredients for the cleaning liquid medium (e.g., a surfactant, ammonium hydroxide, hydrogen peroxide, water, and optional ingredients including a complexing agent) and then mixing the resultant mixture with the remaining ingredients. Alternatively, all the ingredients may be mixed at a time.

In the cleaning method of the invention, the cleaning liquid medium is brought into direct contact with a substrate. Examples of techniques for contacting the cleaning liquid medium with the substrate include: a dipping method in which a cleaning tank is filled with the cleaning liquid medium and the substrate is immersed therein; a spinning method in which the substrate is rotated at a high speed while allowing the cleaning liquid medium fed through a nozzle to flow over the substrate; and a spraying method in which the cleaning liquid medium is sprayed over the substrate to clean it. Examples of apparatus usable for conducting such cleaning operations include a batch cleaning apparatus in which two or more substrates placed in a cassette are simultaneously cleaned and a sheet-by-sheet cleaning apparatus in which one substrate attached to a holder is cleaned. The cleaning method of the invention is applicable to any of the techniques described above. It is, however, preferred to apply the cleaning method of the invention to, in particular, the sheet-by-sheet cleaning apparatus, in which a reduction in cleaning period and a reduction in cleaning liquid medium amount are desired. The cleaning method of the invention satisfies these desires. It is also preferred to apply the cleaning method of the invention to the batch cleaning apparatus because a higher particle-removing effect is obtained.

Although the cleaning may be conducted at room temperature, it may be performed with heating for the purpose of improving the cleaning effect. The cleaning is conducted at a temperature in the range of generally from room temperature to 90° C., preferably from 40 to 80° C.

The time period of this cleaning is generally from 30 seconds to 30 minutes, preferably from 1 to 15 minutes, in the case of batch cleaning, and is generally from 1 second to 5 minutes, preferably from 15 seconds to 1 minute, in the case of sheet-by-sheet cleaning. Too short time periods result in an insufficient cleaning effect. In case where the cleaning period is prolonged excessively, this results only in a reduced throughput and no effect compensating for the prolongation of cleaning period is expected.

The cleaning with the cleaning liquid medium may be conducted in combination with cleaning with a physical force, e.g., mechanical cleaning by scrubbing with a cleaning brush or ultrasonic cleaning. In particular, use of ultrasonic irradiation or brush scrubbing in combination with the cleaning with the cleaning liquid medium is preferred in that the ability to remove particulate contaminants is further improved, leading to a reduction in cleaning time period. It is especially preferred to irradiate the substrate with an ultrasonic having a frequency of 0.5 MHz or higher because this irradiation and the surfactant produce a synergistic effect to greatly improve the ability to remove particles on a 0.1 μm level.

The other substrate surface cleaning liquid medium of the invention will be explained next.

The other substrate surface cleaning liquid medium of the invention is a cleaning liquid medium which, when used for cleaning a substrate surface, attains a percentage removal of particles of 94% or higher after the cleaning with respect to the removal of particles having a particle diameter of 0.06 μm or larger, i.e., fine particles such as, e.g., silica particles, alumina particles present on the surface, and which, when used for cleaning a substrate surface having a silicon thermal oxide film thereon, etches the silicon thermal oxide film to a depth of 1 nm or less.

The term "after the cleaning" as used for specifying this substrate surface cleaning liquid medium of the invention means that the substrate surface has been contacted with this substrate surface cleaning liquid medium. More specifically, that term means that the substrate surface has been in contact with the cleaning liquid medium for at least 1 minute. In this contact, the substrate surface cleaning liquid medium may be stationary or flowing. Any desired method may be used for the contact, and examples thereof include the dipping method, spinning method, and spraying method described above.

This substrate surface cleaning liquid medium of the invention is also characterized in that when the cleaning liquid medium is used for cleaning a substrate surface having a silicon thermal oxide film thereon, it etches the silicon thermal oxide film to a depth of 1 nm or less.

This substrate surface cleaning liquid medium of the invention produces an excellent effect with respect to each of the ability to remove particles from the substrate surface even in cleaning at a relatively low temperature of about from room temperature to 50° C. and the property of inhibiting the silicon thermal oxide film from being etched.

In particular, this cleaning liquid medium preferably is one which after the cleaning attains a percentage removal of particles of 94% or higher when the temperature thereof during contact with the substrate surface was 60° C. or lower, desirably 50° C. or lower. In this cleaning, too low cleaning liquid medium temperatures may result in reduced cleaning performance. Consequently, the temperature thereof is preferably not lower than room temperature, more preferably 40° C. or higher.

This substrate surface cleaning liquid medium of the invention may suitably be acidic, neutral, or alkaline according to the substrate to be cleaned. However, the cleaning liquid medium preferably is alkaline because the alkaline cleaning liquid medium has the excellent ability to remove particles.

This substrate surface cleaning liquid medium of the invention can have any desired composition. However, this cleaning liquid medium preferably has the substrate surface cleaning liquid medium composition according to the invention described above. Namely, it preferably comprises the following ingredients (A), (B), (C), and (D), has a pH of 9 or higher, and has a content of ingredient (C) of from 0.01 to 4% by weight.

(A) An ethylene oxide addition type surfactant which has an optionally substituted hydrocarbon group and a polyoxyethylene group in the same molecular structure and in which the ratio of the number of carbon atoms contained in the hydrocarbon group (m) to the number of oxyethylene groups in the polyoxyethylene group (n), i.e., m/n, is 1.5 or less,
(B) An alkali ingredient,
(C) Hydrogen peroxide, and
(D) Water.

Specific embodiments of the invention will be explained below by reference to Examples. However, the invention should not be construed as being limited to the following Examples in any way unless the invention departs from the spirit thereof.

(Preparation of Contaminated Silicon Wafer)

A 4-inch silicon wafer was immersed in an acidic aqueous solution having a pH of about 3 containing dispersed therein $Si_3N_4$ particles having particle diameters of about from 0.05 to 3 μm and an average particle diameter of about 0.3 μm in a concentration of 0.05 mg/l.

After the immersion, the silicon wafer was rinsed with ultrapure water for 10 minutes and dried with nitrogen blowing or a spin-drier. Thus, a silicon wafer contaminated with $Si_3N_4$ particles was obtained.

Silicon wafer analysis for $Si_3N_4$ particles present thereon was conducted in the following manner. The contaminated silicon wafer and silicon wafers which had been cleaned were analyzed by the same method. A laser surface analyzer (LS-5000, manufactured by Hitachi Engineering Co., Ltd.) was used to count the $Si_3N_4$ particles. In preparing the contaminated silicon wafer, the number of the $Si_3N_4$ particles present on the silicon wafer was regulated so as to be in the range of from 2,000 to 10,000 per 4-inch silicon wafer.

EXAMPLE 1 AND COMPARATIVE EXAMPLE 1

The silicon wafer contaminated with $Si_3N_4$ particles was cleaned for particle removal with an APM 1 cleaning liquid medium (cleaning liquid medium consisting of an aqueous solution prepared by mixing 29% by weight ammonia water, 31% by weight aqueous hydrogen peroxide solution, and water in a ratio of 1/2/40 by volume) or with a cleaning liquid medium prepared by adding the surfactant shown in Table 1 to the APM 1. These two cleaning liquid mediums had a pH of about 10.5. The liquid medium temperature and the cleaning time were regulated to 70° C. and 10 minutes, respectively, and ultrasonic irradiation was not conducted. The cleaning was conducted by the dip cleaning method.

The number of the $Si_3N_4$ particles remaining on the surface of the cleaned silicon wafer obtained was counted, and the contaminant particle-removing ability of the cleaning liquid medium was evaluated in the following five grades based on the degree of removal determined from that number. The degrees of removal of 90% and higher are indicated by removing ability AAA, those of from 70% to less than 90% are indicated by AA, those of from 50% to less than 70% are indicated by A, those of from 30% to less than 50% are indicated by B, and those less than 30% are indicated by C. The results obtained are shown in Table 1.

The solubility of ingredient (A) in each cleaning liquid medium was evaluated based on the following criteria. When a cleaning liquid medium placed in a rectangular quartz vessel with a capacity of about 4 l to a depth of about 10 cm had the same clarity as the cleaning liquid medium containing no ingredient (A), the solubility of the ingredient (A) in this cleaning liquid medium was rated as good. When a cleaning liquid medium thus placed in the vessel had no clarity, i.e., was turbid, e.g., milk-white, then the solubility of the ingredient (A) in this cleaning liquid medium was rated as poor. The results obtained are shown in Table 1.

TABLE 1

| | Cleaning agent ingredients | | | | | | | | | |
|---|---|---|---|---|---|---|---|---|---|---|
| | Surfactant (A) | | | | Alkali ingredient (B) Kind | Hydrogen peroxide (C) Concentration (wt %) | pH of cleaning liquid medium | Ultrasonic irradiation | Solubility | Particle-removing ability |
| | Structural formula | m | n | m/n | Concentration (wt ppm) | | | | | | |
| Example 1 | $C_{12}H_{25}O-(C_2H_4O)_{11}H$ | 12 | 11 | 1.1 | 33 | ammonium hydroxide | 1.4 | about 10.5 | not conducted | good | A |
| Comparative Example 1 | nil | — | — | — | 0 | ammonium hydroxide | 1.4 | about 10.5 | not conducted | good | C |

Cleaning method, dip cleaning; Kind of APM, APM 1; Cleaning liquid medium temperature, 70° C.; Cleaning time, 10 min Table 1 shows that the surfactant according to the invention had distinctly good solubility and the cleaning liquid medium containing this surfactant had a satisfactory particulate-contaminant-removing ability.

EXAMPLE 2 AND COMPARATIVE EXAMPLE 2

Cleaning was conducted in the same manner as in Example 1, except that use was made of the same APM 1 cleaning liquid medium as in Example 1 or a cleaning liquid medium prepared by adding the surfactant shown in Table 2 to the APM 1, and that ultrasonic irradiation was conducted. For the ultrasonic irradiation was used HI MEGA SONIC (600 W, 950 kHz), manufactured by Kaijo Corp. Those two cleaning liquid mediums had a pH of about 10.5. The results obtained are shown in Table 2.

TABLE 2

| | Cleaning agent ingredients | | | | | | | | | |
|---|---|---|---|---|---|---|---|---|---|---|
| | Surfactant (A) | | | | Alkali ingredient (B) Kind | Hydrogen peroxide (C) Concentration (wt %) | pH of cleaning liquid medium | Ultrasonic irradiation | Solubility | Particle-removing ability |
| | Structural formula | m | n | m/n | Concentration (wt ppm) | | | | | | |
| Example 2 | $C_{12}H_{25}O-(C_2H_4O)_{11}H$ | 12 | 11 | 1.1 | 33 | ammonium hydroxide | 1.4 | about 10.5 | conducted | good | AAA |
| Comparative Example 2 | nil | — | — | — | 0 | ammonium hydroxide | 1.4 | about 10.5 | conducted | good | A |

Cleaning method, dip cleaning; Kind of APM, APM 1; Cleaning liquid medium temperature, 70° C.; Cleaning time, 10 min Table 2 shows that the surfactant according to the invention had distinctly good solubility and the cleaning liquid medium containing this surfactant had a satisfactory particle-removing ability.

EXAMPLE 3 AND COMPARATIVE EXAMPLE 2

Cleaning was conducted in the same manner as in Example 2, except that use was made of the same APM 1 cleaning liquid medium as in Example 2 or a cleaning liquid medium prepared by adding the surfactant and complexing agent shown in Table 2 to the APM 1. Cleaning for removing metallic contaminants was further conducted in the following manner.

(Preparation of Contaminated Silicon Wafer)

A 4-inch silicon wafer was immersed in an APM cleaning liquid medium containing ions of metals (Fe and Cu). The APM cleaning liquid medium was prepared by mixing 29% by weight ammonia water, 31% by weight aqueous hydrogen peroxide solution, and water in a ratio of 1/1/5 by volume. The metal ion-containing APM cleaning liquid medium was prepared by adding metal ion-containing aqueous solutions to that APM cleaning liquid medium in such amounts as to result in an Fe content of 20 ppb and a Cu content of 1 ppm.

After the immersion, the silicon wafer was rinsed with ultrapure water for 10 minutes and dried with nitrogen blowing. Thus, a silicon wafer contaminated with metals was obtained.

Silicon wafer analysis for metals (Fe and Cu) present thereon was conducted in the following manner. The contaminated silicon wafer and silicon wafers which had been cleaned were analyzed by the same method. The metals present on the surface of each wafer were recovered with an aqueous solution containing 0.1% by weight hydrofluoric acid and 1% by weight hydrogen peroxide. This solution was then analyzed with an inductively-coupled-plasma mass spectrometer (ICP-MS) to determine the amount of each metal, which was converted to concentration on the substrate surface (atoms/cm$^2$). The thus-obtained results of the analysis of the contaminated silicon wafer are shown in Table 3.

The silicon wafer contaminated with metals was cleaned for metal removal with an APM 2 cleaning liquid medium (cleaning liquid medium consisting of an aqueous solution prepared by mixing 29% by weight ammonia water, 31% by weight aqueous hydrogen peroxide solution, and water in a ratio of 1/1/30 by volume) or with a cleaning liquid medium prepared by adding the surfactant and complexing agent shown in Table 3 to the APM 2. These two cleaning liquid mediums had a pH of about 10.5. The liquid medium temperature and the cleaning time were regulated to 60° C. and 10 minutes, respectively, and the cleaning was conducted by the dip cleaning method. The amounts of the metals (Fe and Cu) remaining on the cleaned silicon wafer surface are shown in Table 3.

EXAMPLES 4 TO 10 AND COMPARATIVE EXAMPLES 3 TO 5

Cleaning was conducted in the same manner as in Example 1, except that use was made of an APM 3 cleaning liquid medium (cleaning liquid medium consisting of an aqueous solution prepared by mixing 29% by weight ammonia water, 31% by weight aqueous hydrogen peroxide solution, and water in a ratio of 1/2/60 by volume) or cleaning liquid mediums prepared by adding each of the surfactants shown in Table 4 to the APM 3, that the cleaning was conducted with a sheet-by-sheet cleaning apparatus at a liquid medium temperature of room temperature for a cleaning time of 30 seconds, and that ultrasonic irradiation was used in combination with the cleaning.

This cleaning with a sheet-by-sheet cleaning apparatus was conducted by the general method. The specific procedure is as follows. While the contaminated silicon wafer was kept being revolved in the circumferential direction, each cleaning liquid medium was continuously applied to the wafer surface at a constant flow rate for a given period (cleaning time) to clean the surface. Immediately after the cleaning, the silicon wafer was rinsed with ultrapure water and spin-dried to obtain a cleaned silicon wafer. The rotational speed of the silicon wafer was 600 rpm, and the flow

TABLE 3

| | Cleaning agent ingredients | | | | | | | | | | | Metal-removing ability Concentration ($\times 10^{10}$ atoms/cm$^2$) | |
|---|---|---|---|---|---|---|---|---|---|---|---|---|---|
| | Surfactant (A) | | | | Alkali | Hydrogen peroxide (C) | Complexing agent | | pH of cleaning liquid medium | Solubility | Particle-removing ability | | |
| | Structural formula | m | n | m/n | Concentration (wt ppm) | ingredient (B) Kind | Concentration (wt %) | Kind | Concentration (wt ppm) | | | | Fe | Cu |
| Example 3 | C$_{12}$H$_{25}$O—(C$_2$H$_4$O)$_{11}$H | 12 | 11 | 1.1 | 33 | ammonium hydroxide | 1.4 | EDDHA | 28 | about 10.5 | good | AAA | <0.1 | <0.1 |
| Comparative Example 2 | nil | — | — | — | 0 | ammonium hydroxide | 1.4 | — | 0 | about 10.5 | good | A | 500 | 3 |
| Before cleaning (silicon wafer contaminated with metals) | | | | | | | | | | | | | 1000 to 3000 | 3000 to 5000 |

Cleaning method, dip cleaning; Cleaning time, 10 min
"Particle removal" 1/2/40; cleaning liquid medium temperature, 70° C.
"Metal removal" 1/1/30; cleaning liquid medium temperature, 60° C.

Table 3 shows that the surfactant according to the invention had distinctly good solubility and the cleaning liquid medium containing this surfactant in combination with the complexing agent had a satisfactory particulate-contaminant-removing ability and satisfactory contaminant-metal-removing ability.

rate of the cleaning liquid medium was 1 l/min. The cleaning liquid mediums each had a pH of about 10.5. The results obtained are shown in Table 4.

The cleaning liquid mediums in which the solubility of the surfactant was "poor" had the high possibility that the insoluble ingredient might contaminate the substrate for devices and thus reduce device performance or yield.

Because of this, these cleaning liquid mediums were not evaluated for particulate-contaminant-removing ability. The same applies also to Comparative Example 6.

TABLE 4

| | Cleaning agent ingredients | | | | | | | | |
|---|---|---|---|---|---|---|---|---|---|
| | Surfactant (A) | | | | Alkali ingredient (B) Kind | Hydrogen peroxide (C) Concentration (wt %) | pH of cleaning liquid medium | Solubility | Particle-removing ability |
| | Structural formula | m | n | m/n | Concentration (wt ppm) | | | | | |
| Example 4 | $C_{12}H_{25}O(C_2H_4O)_{11}H$ | 12 | 11 | 1.1 | 100 | ammonium hydroxide | 1 | about 10.5 | good | AA |
| Example 5 | $C_{12}H_{25}O(C_2H_4O)_{11}H$ | 12 | 11 | 1.1 | 30 | ammonium hydroxide | 1 | about 10.5 | good | AA |
| Example 6 | $C_{12}H_{25}O(C_2H_4O)_{11}H$ | 12 | 11 | 1.1 | 20 | ammonium hydroxide | 1 | about 10.5 | good | AA |
| Example 7 | $C_{12}H_{25}O(C_2H_4O)_{11}H$ | 12 | 11 | 1.1 | 10 | ammonium hydroxide | 1 | about 10.5 | good | A |
| Example 8 | $C_{12}H_{25}O(C_2H_4O)_{13}H$ | 12 | 13 | 0.9 | 100 | ammonium hydroxide | 1 | about 10.5 | good | AA |
| Example 9 | $C_8H_{17}O(C_2H_4O)_8H$ | 8 | 8 | 1.0 | 100 | ammonium hydroxide | 1 | about 10.5 | good | A |
| Example 10 | $C_{18}H_{35}O(C_2H_4O)_{30}H$ | 18 | 30 | 0.6 | 100 | ammonium hydroxide | 1 | about 10.5 | good | A |
| Comparative Example 3 | nil | — | — | — | 0 | ammonium hydroxide | 1 | about 10.5 | good | B |
| Comparative Example 4 | $C_{12}H_{25}O(C_2H_4O)_4H$ | 12 | 4 | 3 | 100 | ammonium hydroxide | 1 | about 10.5 | poor | not conducted |
| Comparative Example 5 | $C_{12}H_{25}O(C_2H_4O)_5H$ | 12 | 5 | 2.4 | 100 | ammonium hydroxide | 1 | about 10.5 | poor | not conducted |

Cleaning method, sheet-by-sheet cleaning; Kind of APM, APM 3; Cleaning temperature, room temperature; Cleaning time, 30 sec Table 4 shows that the surfactants according to the invention had distinctly good solubility and the cleaning liquid mediums containing these surfactants had a satisfactory particulate-contaminant-removing ability.

EXAMPLE 11 AND COMPARATIVE EXAMPLE 3

Cleaning for particulate-contaminant removal was conducted in the same manner as in Example 4, except that use was made of the same APM 3 cleaning liquid medium as in Example 4 or a cleaning liquid medium prepared by adding the surfactant and complexing agent shown in Table 5 to the APM 3. Furthermore, cleaning for metallic-contaminant removal was conducted in the same manner as in Example 3, except that use was made of the same APM 1 cleaning liquid medium as in Example 1 or a cleaning liquid medium prepared by adding the surfactant and complexing agent shown in Table 5 to the APM 1. The cleaning time and cleaning liquid medium temperature were regulated to 60 seconds and 80° C., respectively. Those cleaning liquid mediums each had a pH of about 10.5.

TABLE 5

| | Cleaning agent ingredients | | | | | | | | | | | | Metal-removing ability Concentration ($\times 10^{10}$ atoms/cm$^2$) | |
|---|---|---|---|---|---|---|---|---|---|---|---|---|---|---|
| | Surfactant (A) | | | | | Alkali ingredient (B) Kind | Hydrogen peroxide (C) Concentration (wt %) | Complexing agent | | pH of cleaning liquid medium | Solubility | Particle-removing ability | | |
| | Structural formula | m | n | m/n | Concentration (wt ppm) | | | Kind | Concentration (ppm) | | | | Fe | Cu |
| Example 11 | $C_{12}H_{25}O—(C_2H_4O)_{11}H$ | 12 | 11 | 1.1 | 100 | ammonium hydroxide | 1 | EDDHA | 70 | about 10.5 | good | AA | 9.5 | <0.1 |
| Comparative Example 3 | nil | — | — | — | 0 | ammonium hydroxide | 1 | — | — | about 10.5 | good | B | >1000 | 3 |

TABLE 5-continued

| Cleaning agent ingredients | | | | | | | | | | | Metal-removing ability Concentration ($\times 10^{10}$ atoms/cm$^2$) | |
|---|---|---|---|---|---|---|---|---|---|---|---|---|
| Surfactant (A) | | | | Alkali | Hydrogen peroxide (C) | | Complexing agent | | pH of cleaning liquid medium | Solubility | Particle-removing ability | | |
| Structural formula | m | n | m/n | Concentration (wt ppm) | ingredient (B) Kind | Concentration (wt %) | Kind | Concentration (ppm) | | | | Fe | Cu |
| Before cleaning (silicon wafer contaminated with metals) | | | | | | | | | | | | 1000 to 3000 | 3000 to 5000 |

Cleaning method, sheet-by-sheet cleaning
"Particle removal" 1/2/60; cleaning time, 30 sec; cleaning liquid medium temperature, room temperature
"Metal removal" 1/2/40; cleaning time, 60 sec; cleaning liquid medium temperature, 80° C.

Table 5 shows that the surfactant according to the invention had distinctly good solubility and the cleaning liquid mediums containing this surfactant in combination with the complexing agent had a satisfactory particulate-contaminant-removing ability and satisfactory metallic-contaminant-removing ability.

EXAMPLES 12 AND 13 AND COMPARATIVE EXAMPLE 6

Cleaning was conducted in the same manner as in Example 4, except that use was made of the same APM 3 cleaning liquid medium as in Example 4 or cleaning liquid mediums prepared by adding each of the compounds shown in Table 6 to the APM 3, and that the cleaning liquid medium temperature and cleaning time were regulated to 50° C. and 60 seconds, respectively. Those cleaning liquid mediums each had a pH of about 10.5. The results obtained are shown in Table 6.

Table 6 shows that the surfactants according to the invention had distinctly good solubility and the cleaning liquid mediums containing these surfactants had a satisfactory particulate-contaminant-removing ability.

EXAMPLES 14 TO 24 AND COMPARATIVE EXAMPLES 7 TO 11

"Evaluation of Ability to Remove Fine Contaminant Particles ($\geq 0.06$ μm)"

A 4-inch silicon wafer to which from 7,000 to 12,000 $Si_3N_4$ particles having a diameter of 0.06 μm or larger were adhered as a substrate was cleaned with the APM 1 cleaning liquid medium or cleaning liquid mediums prepared by adding each of the surfactants shown in Table 7 to the APM 1 by means of a sheet-by-sheet cleaning apparatus to remove particles. This cleaning was conducted under the conditions of a silicon wafer rotational speed of 1,000 rpm, cleaning liquid medium feed rate of 1 l/min, cleaning time of 60

TABLE 6

| | Cleaning agent ingredients | | | | | | | | | |
|---|---|---|---|---|---|---|---|---|---|---|
| | Surfactant (A) | | | | Alkali | Hydrogen peroxide (C) | pH of cleaning liquid medium | Solubility | Particle-removing ability |
| | Structural formula | m | n | m/n | Concentration (wt ppm) | ingredient (B) Kind | Concentration (wt %) | | | |
| Example 12 | $C_{12}H_{25}O$—$(C_2H_4O)_{11}H$ | 12 | 11 | 1.1 | 100 | ammonium hydroxide | 1 | about 10.5 | good | AAA |
| Example 13 | $C_8H_{17}O$—$(C_2H_4O)_8H$ | 8 | 8 | 1.0 | 100 | ammonium hydroxide | 1 | about 10.5 | good | AA |
| Comparative Example 6 | $C_{12}H_{25}O$—$(C_2H_4O)_7H$ | 12 | 7 | 1.7 | 100 | ammonium hydroxide | 1 | about 10.5 | poor | not conducted |

Cleaning method, sheet-by-sheet cleaning; Kind of APM, APM 3; Cleaning temperature, 50° C.; Cleaning time, 60 sec seconds, and liquid medium temperature of 50° C. Ultrasonic irradiation was used in combination with the cleaning. Those cleaning liquid mediums each had a pH of about 10.5.

With respect to silicon wafer analysis for particles present thereon, a laser surface analyzer (LS-6600, manufactured by Hitachi Engineering Co., Ltd.) was used to count the particles.

The number of the particles remaining on the surface of each cleaned silicon wafer obtained through the cleaning was counted, and the degree of contaminant-particle removal was determined therefrom and evaluated in the following five grades.

Namely, the degrees of removal of 90% and higher are indicated by removing ability AAA, those of from 70% to less than 90% are indicated by AA, those of from 50% to less than 70% are indicated by A, those of from 30% to less than 50% are indicated by B, and those less than 30% are indicated by C. The results obtained are shown in Table 7.

"Evaluation of Solubility"

The solubility of the surfactant (A) in each cleaning liquid medium was evaluated based on the following criteria. When a cleaning liquid medium placed in a rectangular quartz vessel with a capacity of about 4 l to a depth of about 10 cm had the same clarity as the cleaning liquid medium to which the surfactant (A) had not been added, then the solubility of the surfactant (A) in this cleaning liquid medium was rated as good. When a cleaning liquid medium thus placed in the vessel had no clarity, i.e., was turbid, e.g., milk-white, then the solubility of the surfactant (A) in this cleaning liquid medium was rated as poor. Also with respect to the cleaning liquid mediums in which the surfactant (A) was in an incompletely dissolved state, the solubility of the surfactant (A) was rated as poor. The results obtained are shown in Table 7. As stated under "Examples 4 to 10 and Comparative Examples 3 to 5", the cleaning liquid mediums in which the solubility of the surfactant was "poor" were not subjected to the evaluation of particulate-contaminant-removing ability.

TABLE 7

| | Cleaning agent ingredients | | | | | | | | |
|---|---|---|---|---|---|---|---|---|---|
| | Surfactant (A) | | | | Alkali | Hydrogen peroxide (C) | pH of cleaning liquid medium | Solubility | Particle-removing ability |
| | Structural formula | m | n | m/n | Concentration (wt ppm) | ingredient (B) Kind | Concentration (wt %) | | |
| Example 14 | $C_8H_{17}O(C_2H_4O)_{20}H$ | 8 | 20 | 0.4 | 70 | ammonium hydroxide | 1.4 | about 10.5 | good | A |
| Example 15 | $C_{12}H_{25}O(C_2H_4O)_{11}H$ | 12 | 11 | 1.1 | 70 | ammonium hydroxide | 1.4 | about 10.5 | good | AA |
| Example 16 | $C_{12}H_{25}O(C_2H_4O)_{20}H$ | 12 | 20 | 0.6 | 70 | ammonium hydroxide | 1.4 | about 10.5 | good | A |
| Example 17 | $C_{12}H_{25}O(C_2H_4O)_{23}H$ | 12 | 23 | 0.5 | 70 | ammonium hydroxide | 1.4 | about 10.5 | good | A |
| Example 18 | $C_{12}H_{25}O(C_2H_4O)_{30}H$ | 12 | 30 | 0.4 | 70 | ammonium hydroxide | 1.4 | about 10.5 | good | A |
| Example 19 | $C_{13}H_{27}O(C_2H_4O)_{8.5}H$ | 13 | 8.5 | 1.5 | 70 | ammonium hydroxide | 1.4 | about 10.5 | good | AA |
| Example 20 | $C_{16}H_{33}O(C_2H_4O)_{15}H$ | 16 | 15 | 1.1 | 70 | ammonium hydroxide | 1.4 | about 10.5 | good | AA |
| Example 21 | $C_{16}H_{33}O(C_2H_4O)_{23}H$ | 16 | 23 | 0.7 | 70 | ammonium hydroxide | 1.4 | about 10.5 | good | A |
| Example 22 | $C_{18}H_{37}O(C_2H_4O)_{15}H$ | 18 | 15 | 1.2 | 70 | ammonium hydroxide | 1.4 | about 10.5 | good | A |
| Example 23 | $C_{18}H_{37}O(C_2H_4O)_{30}H$ | 18 | 30 | 0.6 | 70 | ammonium hydroxide | 1.4 | about 10.5 | good | B |
| Example 24 | $C_{18}H_{37}O(C_2H_4O)_{50}H$ | 18 | 50 | 0.4 | 70 | ammonium hydroxide | 1.4 | about 10.5 | good | A |
| Comparative Example 7 | nil | — | — | — | 0 | ammonium hydroxide | 1.4 | about 10.5 | — | C |
| Comparative Example 8 | $C_8H_{17}O(C_2H_4O)_4H$ | 8 | 4 | 2.0 | 70 | ammonium hydroxide | 1.4 | about 10.5 | poor | not conducted |
| Comparative Example 9 | $C_{13}H_{27}O(C_2H_4O)_5H$ | 13 | 5 | 2.6 | 70 | ammonium hydroxide | 1.4 | about 10.5 | poor | not conducted |
| Comparative Example 10 | $C_{16}H_{33}O(C_2H_4O)_8H$ | 16 | 8 | 2.0 | 70 | ammonium hydroxide | 1.4 | about 10.5 | poor | not conducted |
| Comparative Example 11 | $C_{18}H_{37}O(C_2H_4O)_{11}H$ | 18 | 11 | 1.6 | 70 | ammonium hydroxide | 1.4 | about 10.5 | poor | not conducted |

Cleaning method, sheet-by-sheet cleaning; Kind of APM, APM 1; Cleaning temperature, 50° C.; Cleaning time, 60 sec Table 7 shows that the surfactants (A) according to a constituent requirement of the invention had good solubility, and the cleaning liquid mediums of the invention had a satisfactory particulate-contaminant-removing ability.

EXAMPLES 25 AND 26 AND COMPARATIVE EXAMPLES 12 AND 13

A 6-inch silicon wafer to which from 4,000 to 5,000 $SiO_2$ particles having a diameter of 0.06 μm or larger were adhered as a substrate was cleaned with the APM 1 cleaning liquid medium or a cleaning liquid medium prepared by adding the surfactant shown in Table 8 to the APM 1 by the dip cleaning method to remove particles. The cleaning time and temperatures used are shown in Table 8. Ultrasonic irradiation was used in combination with the cleaning. For the ultrasonic irradiation was used HI MEGA SONIC (600 W, 950 kHz), manufactured by Kaijo Corp. Those two cleaning liquid mediums had a pH of about 10.5.

With respect to silicon wafer analysis for particles present thereon, a laser surface analyzer (LS-6600, manufactured by Hitachi Engineering Co., Ltd.) was used to count the particles. The degree of particle removal (%) determined therefrom is shown in Table 8.

"Measurement of Etching Depth"

A silicon wafer piece having a thermal oxide film having a thickness of 1,000 Å was immersed in a cleaning liquid medium, subsequently rinsed with running pure water for 5 minutes, and then dried with $N_2$ blowing. The thickness of the film of the test piece was measured before and after the cleaning, and the etching depth was calculated using the following equation.

Etching depth ($nm$)=[film thickness before cleaning ($nm$)]−[(film thickness after cleaning ($nm$)]

For the film thickness measurement for the test piece, a light interference type film thickness meter (NanoSpec L-6100, manufactured by Nanometrics, Inc.) was used. The results obtained are shown in Table 8.

TABLE 8

| | Kind of cleaning agent | Surfactant (A) Structural formula | m | n | m/n | Concentration (wt ppm) | Alkali ingredient (B) Kind | Hydrogen peroxide (C) Concentration (wt %) | pH of cleaning liquid medium | Cleaning liquid medium temperature (° C.) | Cleaning time (min) | Etching depth (nm) | Degree of particle removal (%) |
|---|---|---|---|---|---|---|---|---|---|---|---|---|---|
| Example 25 | APM 1 | $C_{12}H_{25}O-(C_2H_4O)_{11}H$ | 12 | 11 | 1.1 | 33 | ammonium hydroxide | 1.4 | about 10.5 | 40 | 10 | 0.4 | 96 |
| Example 26 | APM 1 | $C_{12}H_{25}O-(C_2H_4O)_{11}H$ | 12 | 11 | 1.1 | 33 | ammonium hydroxide | 1.4 | about 10.5 | 50 | 10 | 0.7 | 97 |
| Comparative Example 12 | APM 1 | nil | — | — | — | 0 | ammonium hydroxide | 1.4 | about 10.5 | 50 | 10 | 0.7 | 91 |
| Comparative Example 13 | APM 1 | nil | — | — | — | 0 | ammonium hydroxide | 1.4 | about 10.5 | 80 | 10 | 2.8 | 94 |

Cleaning method, sheet-by-sheet cleaning; Kind of APM, APM 1

Table 8 shows that the cleaning liquid mediums of the invention attained distinctly high degrees of removal of particles having a diameter of 0.06 μm or larger, which were not lower than 94%, and the depths of etching caused by these were not larger than 1 nm.

EXAMPLE 27 AND COMPARATIVE EXAMPLE 14

Cleaning was conducted in the same manner as in Example 12, except that use was made of the APM 3 cleaning liquid medium or a cleaning liquid medium prepared by adding the surfactant shown in Table 9 to the APM 3. An etching depth measurement was made in the same manner as in Example 25. The results obtained are shown in Table 9.

TABLE 9

| | | Cleaning agent ingredients | | | | | | | | | |
|---|---|---|---|---|---|---|---|---|---|---|---|
| | Kind of cleaning agent | Surfactant (A) | | | | Alkali ingredient (B) Kind | Hydrogen peroxide (C) Concentration (wt %) | pH of cleaning liquid medium | Cleaning liquid medium temperature (° C.) | Cleaning time (min) | Etching depth (nm) | Degree of particle removal (%) |
| | | Structural formula | m | n | m/n | Concentration (wt ppm) | | | | | | |
| Example 27 | APM 3 | $C_{12}H_{25}O-(C_2H_4O)_{11}H$ | 12 | 11 | 1.1 | 100 | ammonium hydroxide | 1 | about 10.5 | 50 | 1 | 0.07 | 94 |
| Comparative Example 14 | APM 3 | nil | — | — | — | 0 | ammonium hydroxide | 1 | about 10.5 | 50 | 1 | 0.07 | 86 |

Cleaning method, sheet-by-sheet cleaning; Kind of APM, APM 3

Table 9 shows that the cleaning liquid medium of the invention attained a distinctly high degree of particle removal, which was not lower than 94%.

As apparent from the results given above, the cleaning liquid mediums of the invention are superior in surfactant solubility and in the ability to remove particulate contaminants to the conventional cleaning liquid mediums (Comparative Examples). Of these cleaning liquid mediums, those containing a complexing agent in combination with the surfactant are more preferred in that they have the improved ability to remove metallic contaminants while having the intact surfactant solubility and particle-removing ability. Furthermore, the cleaning liquid mediums of the invention are excellent cleaning liquid mediums which attain an etching depth of 1 nm or smaller and a degree of particle removal of 94% or higher with respect to the removal of fine particles having a diameter of 0.06 μm or larger.

With the cleaning liquid mediums of the invention, particulate contaminants present on substrates to be cleaned, such as silicon wafers, can be efficiently removed to a high degree in a short time period. Consequently, these cleaning liquid mediums are exceedingly useful when industrially used in methods of contaminant removal in steps in the production of semiconductor devices, display devices, or the like.

While the invention has been described in detail and with reference to specific embodiments thereof, it will be apparent to one skilled in the art that various changes and modifications can be made therein without departing from the spirit and scope thereof.

This application is based on Japanese patent application No. 2001-350947 filed on Nov. 16, 2001, the entire contents thereof being hereby incorporated by reference.

What is claimed is:

1. A method of semiconductor substrate cleaning comprising cleaning a semiconductor substrate with a semiconductor substrate surface cleaning liquid medium while irradiating the semiconductor substrate with ultrasound having a frequency of 0.5 MHz or higher, wherein the semiconductor substrate surface cleaning medium consists essentially of the ingredients (A), (B), (C), and (D), wherein (A) is an ethylene oxide addition type surfactant which has an optionally substituted hydrocarbon group and a polyoxyethylene group in the same molecular structure and in which the ratio of the number of carbon atoms contained in the hydrocarbon group (m) to the number of oxyethylene groups in the polyoxyethylene group (n) is 1.5 or less, wherein ethylene oxide addition type surfactant is selected from the group consisting of at least one polyoxyalkylene alkyl ether, at least one polyoxyalkylene fatty acid ester, at least one polyoxyalkylene alkyl amine, at least one polyoxyalkylene alkyl ether sulfate, and combinations thereof;

(B) is an alkali ingredient;

(C) is hydrogen peroxide; and (D) is water;

wherein the substrate surface cleaning liquid medium has a pH of from 10.5 to 11.5, an ingredient (A) content ranging from 0.0001% to 0.01% by weight, and an ingredient (C) content ranging from 0.01 to 4% by weight.

2. The method of claim 1, wherein m/n is $0.5 \leq m/n \leq 1.5$, in the semiconductor substrate surface cleaning medium.

3. The method of claim 1, wherein, in the semiconductor substrate surface cleaning liquid medium, ingredient (B) is represented by the following general formula:

wherein $R^1$ represents a hydrogen atom or an alkyl group which may have one or more substituents selected from the group consisting of a hydroxy group, an alkoxy group and a halogen atom, provided that the four $R^1$ s may be the same or different.

4. The method of claim 1, wherein in the semiconductor substrate surface cleaning liquid medium, ingredient (B) is ammonium hydroxide.

5. The method of claim 1, wherein in the semiconductor substrate surface cleaning liquid medium, the number of moles of oxyethylene groups added (n) in ingredient (A) is $10 \leq n \leq 50$.

6. The method of claim 1, wherein in the semiconductor substrate surface cleaning liquid medium, ingredient (A) is a polyoxyethylene alkyl ether.

7. The method of claim 1, wherein in the semiconductor substrate surface cleaning liquid medium, the ratio of the content of ingredient (A), a, to the content of ingredient (C), c, is $1/3000 \leq a/c \leq 1/20$.

8. The method of claim 3, wherein the semiconductor substrate surface cleaning liquid medium further comprises a complexing agent.

9. The method of claim 1, wherein the cleaning is conducted at a temperature of from 40 to 80° C.

10. The method of claim 1, which, when used for cleaning a semiconductor substrate surface, attains a percentage removal of particles of 94% or higher after the cleaning with respect to the removal of particles having a particle diameter of 0.06 μm or larger present on the semiconductor substrate surface, and which, when used for cleaning a semiconductor substrate surface having a silicon thermal oxide film thereon, etches the silicon thermal oxide film to a depth of 1 nm or less.

11. The method of claim 10, wherein the percentage removal of particles is 94% or higher when the semiconductor substrate surface cleaning liquid medium in contact with the semiconductor substrate surface has a temperature of 60° C. or lower.

12. A method of semiconductor substrate cleaning comprising cleaning a semiconductor substrate with a semiconductor substrate surface cleaning liquid medium while irradiating the semiconductor substrate with ultrasound having a frequency of 0.5 MHz or higher,
wherein the semiconductor substrate surface cleaning liquid medium consists essentially of the ingredients (A), (B), (C), (D), and (E) wherein:
(A) is an ethylene oxide addition type surfactant which has an optionally substituted hydrocarbon group and a polyoxyethylene group in the same molecular structure and in which the ratio of the number of carbon atoms contained in the hydrocarbon group (m) to the number of oxyethylene groups in the polyoxyethylene group (n) is 1.5 or less, wherein ethylene oxide addition type surfactant is selected from the group consisting of at least one polyoxyalkylene alkyl ether, at least one polyoxyalkylene fatty acid ester, at least one polyoxyalkylene alkyl amine, at least one polyoxyalkylene alkyl ether sulfate, and combinations thereof;
(B) is an alkali ingredient;
(C) is hydrogen peroxide;
(D) is water; and
(E) is a complexing agent;
wherein the substrate surface cleaning liquid medium has a pH ranging from 10.5 to 11.5 and an ingredient (C) content ranging from 0.01 to 4% by weight.

13. The method of claim 12, wherein in the semiconductor substrate surface cleaning liquid medium, m/n is $0.5 \leq m/n \leq 1.5$.

14. The method of claim 12, wherein in the semiconductor substrate surface cleaning liquid medium, ingredient (B) is represented by the following general formula:

$$(R^1)_4 N^+ OH^-  \qquad (1)$$

wherein $R^1$ represents a hydrogen atom or an alkyl group which may have one or more substituents selected from the group consisting of a hydroxy group, an alkoxy group and a halogen atom, provided that the four $R^1$s may be the same or different, provided that $(R^1)_4 N^+ OH^-$ is not ammonium hydroxide.

15. The method of claim 12, wherein in the semiconductor substrate surface cleaning liquid medium, the number of moles of oxyethylene groups added (n) in ingredient (A) is $10 n \leq 50$.

16. The method of claim 12, wherein in the semiconductor substrate surface cleaning liquid medium, ingredient (A) is a polyoxyethylene alkyl ether.

17. The method of claim 12, wherein in the semiconductor substrate surface cleaning liquid medium, the content of ingredient (A) ranges from 0.0001 to 0.5% by weight.

18. The method of claim 12, wherein in the semiconductor substrate surface cleaning liquid medium, the ratio of the content of ingredient (A), a, to the content of ingredient (C), c, is $1/3000 \leq a/c \leq 1/20$.

19. The method of claim 1, wherein in the semiconductor substrate surface cleaning liquid medium, the content of ingredient (A) is from 0.0003 to 0.1% by weight.

20. The method of claim 12, wherein the cleaning is conducted at a temperature of from 40 to 80° C.

21. The method of claim 12, wherein in the semiconductor substrate surface cleaning liquid medium, the complexing agent is ethylenediaminedi-o-hydroxyphenylacetic acid.

22. The method of claim 1, wherein in the semiconductor substrate surface cleaning liquid medium, the pH is 10.5.

23. The method of claim 12, wherein in the semiconductor substrate surface cleaning liquid medium, the pH is 10.5.

* * * * *